United States Patent [19]

Mahoney et al.

[11] 4,352,029
[45] Sep. 28, 1982

[54] SIGNAL PROCESSING CIRCUITRY

[75] Inventors: Paul F. Mahoney, Brighton; Jerrold L. Bonn, Waltham, both of Mass.

[73] Assignee: Signatron, Inc., Lexington, Mass.

[21] Appl. No.: 103,347

[22] Filed: Dec. 13, 1979

[51] Int. Cl.³ .................. H03K 3/26; G06G 7/16
[52] U.S. Cl. .................. 307/317 R; 307/310; 307/319; 328/160; 455/108; 332/43 B
[58] Field of Search ............ 333/103, 218; 307/319, 307/320, 317, 310; 328/160; 455/108; 332/43 B

[56] References Cited
U.S. PATENT DOCUMENTS

| | | | |
|---|---|---|---|
| 3,019,983 | 2/1962 | Philbrick | 328/160 |
| 3,371,160 | 2/1968 | Harford | 328/160 |
| 3,492,501 | 1/1970 | Allen et al. | 333/103 |
| 4,016,516 | 4/1977 | Sauter et al. | 333/103 |
| 4,224,583 | 9/1980 | Larkin | 333/103 |

Primary Examiner—Stanley D. Miller, Jr.
Assistant Examiner—B. P. Davis
Attorney, Agent, or Firm—Robert F. O'Connell

[57] ABSTRACT

Signal processing circuitry, preferably for use in multiplying two input signals, one at RF frequency and one at base-band frequency, which includes a pair of PIN diodes connected in a generally symmetrical circuit configuration using a single bias supply and including a trimming resistor for controlling the current through a selected one of the diodes so that the characteristics of both diodes can be matched over substantially the complete range of control current values therefor. Further, the circuit configuration permits the use of an easy and effective technique for compensating for temperature changes of the circuit during operation.

10 Claims, 3 Drawing Figures

SIGNAL PROCESSING CIRCUITRY

INTRODUCTION

This invention relates generally to signal processing circuitry and, more particularly, to circuitry which can be utilized to form the product of two input signals, preferably a base-band signal and radio frequency (RF) signal.

BACKGROUND OF THE INVENTION

In many signal processing applications it is desirable to combine two input signals so as to provide the product thereof. For example, it may be necessary in some signal processing systems to form the product of an input radio frequency (RF) signal and a base-band signal. Such signal processing often is required in modem systems, in array antenna systems, in systems using adaptive equalizer circuitry which requires complex multipliers, in interference cancellation systems, or in systems requiring the use of phase shifting circuitry. In such cases it is usually required that a linear multiplication operation be provided over a wide range of input signal levels.

One such circuit which might be considered for use for such purposes is described in U.S. Pat. No. 3,550,041, issued to W. A. Sauter on Dec. 22, 1970. Such patent describes the use of two PIN diodes in a bridge circuit arrangement. While the patent primarily discusses the use of such circuitry for regulating the amplitude of an RF signal with fine resolution over a large dynamic range by utilizing a DC control signal, such circuitry could be adapted for use in forming a product of an RF input signal and the DC control signal.

However, several disadvantages of the circuit disclosed by the Sauter patent arise in this connection. First of all, the circuit requires two bias voltage supplies, one a positive bias supply and the other a negative voltage supply, such bias supply means thereby comprising two independent bias sources for each of the two diodes involved, as disclosed and claimed in the patent. Not only does the requirement for two bias power supplies increase the cost of the overall device, but also the circuit becomes relatively highly sensitive even to small changes in the power supply voltages from either of the bias sources. Such undesired sensitivity arises because the circuit is in a bridge configuration and a change in the power supply level of a bias source affects only the corresponding branch of the bridge, not changing both branches equally.

Another disadvantage is that the Sauter circuit requires the use of substantially exactly matched diodes for its operation over a wide range of control currents. However, no effective technique for adjusting the bias currents to provide such an exact match is suggested by Sauter. If the usual method of matching PIN diodes is utilized, i.e., where a bias current is inserted so that at some value of control current the two diodes have the same resistance, such matching technique does not provide for a match of the diode characteristics over the entire range of control currents which may be involved.

A further disadvantage of the Sauter circuit arises in that the circuit cannot be easily compensated for temperature effects without unbalancing the bridge circuit and thereby adversely affecting its operation.

Hence, the Sauter circuit is not effective in providing linear characteristics for the multiplication of two input signals over a relatively wide range of input signal levels.

BRIEF SUMMARY OF THE INVENTION

The invention utilizes a bridge circuit configuration of PIN diodes which overcomes the disadvantages of the Sauter arrangement. In accordance with the invention the bridge circuit is arranged so that only a single bias power supply is required, such a configuration not only reducing the overall cost thereof but also assuring that the circuit is much less sensitive to changes in power supply voltages and can be effectively compensated for temperature changes.

Further, the birdge circuitry of the invention is arranged to provide means for controlling the current through one of the diodes in a manner such that the diode characteristics of both diodes can be matched over a wide range of control currents rather than merely providing a match at only one value thereof. By using suitably selected circuit component values for the particular applications in which the circuit is to be used, the configuration thereof permits the useful voltage range of the input signals thereto to be compatible with most signal processing circuits with which the circuit can be used, such as conventional operational amplifiers, which may have a voltage range of ±10 volts, for example.

DESCRIPTION OF THE INVENTION

The invention can be described in more detail with the help of the accompanying drawing wherein.

Figure 1:
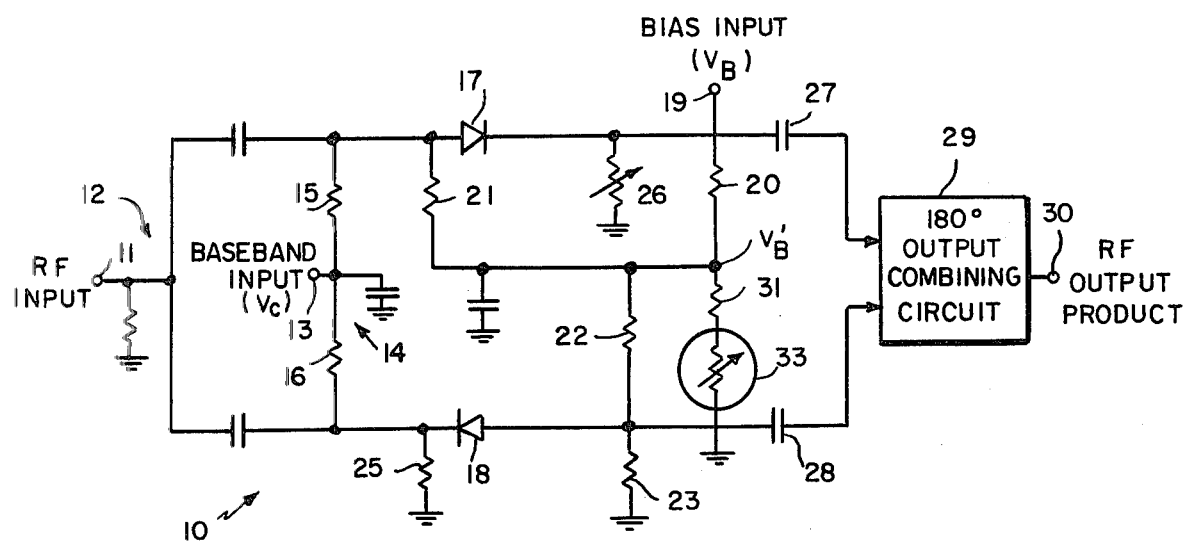
FIG. 1 shows a preferred embodiment of the invention for use in providing the product of two input signals.

As can be seen in FIG. 1, a first RF input signal is supplied to the circuitry of the invention at an input terminal 11 through suitable input circuitry 12 to the anode of a first PIN diode 17 and simultaneously to the cathode of a second PIN diode 18. A second input signal, for example, a base-band signal, is supplied at an input terminal 13 to the anode and cathode of diodes 17 and 18, respectively, via suitable input circuitry 14 which includes resistors 15 and 16.

A bias voltage $V_B$ is applied at a bias input terminal 19 to the anodes of both diodes 17 and 18 via a common resistor 20 and bias resistors 21 and 22, respectively. Resistor 23 is connected from the anode of diode 18 to ground. The outputs from diodes 17 and 18 are supplied to an output combining circuit 29 via capacitors 27 and 28 respectively, combining circuit 29 providing an RF output product signal which represents the product of the RF input signal and the base-band input signal. An output combining circuit, for example, which can be used herein may comprise a suitable center-tapped, balanced transformer circuit, as would be well known to those in the art.

Figure 2:
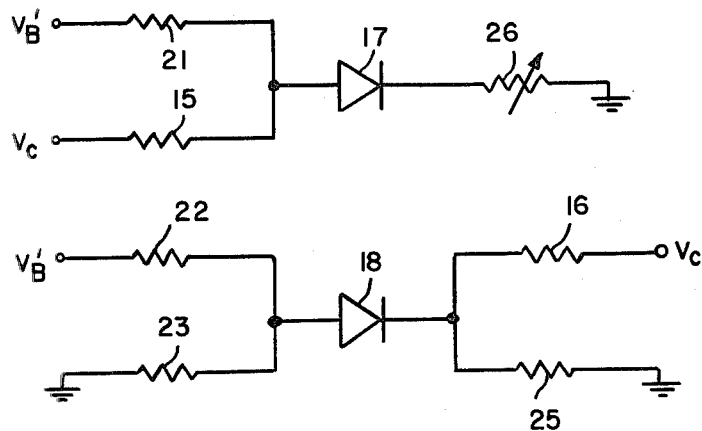
FIG. 2 shows in more simplified diagrammatic form the balanced diode arrangement of the circuit of FIG. 1.

The generally symmetrical arrangement of the diodes can be better understood in the simplified diagram of FIG. 2 wherein the connections of the diodes 17 and 18 to the single bias input source and to the base-band input signal are shown. Thus, the anodes of each of the diodes are connected to one end of input resistors 21 and 22, respectively, the other ends thereof being effectively connected to the bias voltage $V_B$. The anode of diode 17 is also connected via resistor 15 to base-band input signal $V_C$ while the anode of diode 18 is also connected via resistor 23 to ground.

The cathode of diode 17 is connected through variable resistor 26 to ground. The cathode of diode 18 is connected via resistance 16 to base-band input signal $V_C$ and also via resistor 25 to ground. In the circuit of the invention once the diodes 17 and 18 are effectively matched by selecting the desired value of variable resistor 26, the variable resistor can be replaced by a fixed resistor for any specific circuit application.

Figure 3:
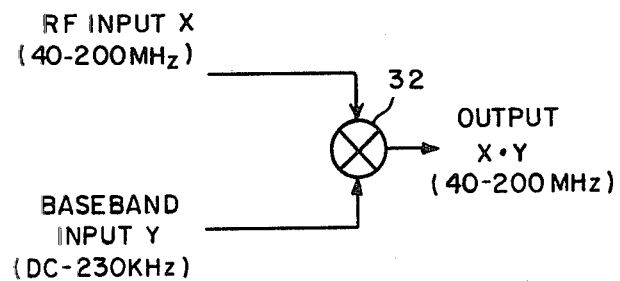
FIG. 3 shows a simplified diagrammatic diagram depicting the multiplier operation of the circuit configuration of FIG. 1.

As shown in FIG. 3, if one desires to multiply an RF input signal X and a base-band input signal Y, the circuitry of the invention effectively acts as a multiplier 32 which produces the product X·Y. An exemplary multiplier in accordance with such principles of operation can be used to provide an appropriate product output for RF input signals over a frequency range from 40 to 200 MHz and for base-band input signals over a frequency range from DC to 230 kHz. It is found that the modulating frequency range and the low end of the RF frequency range are determined primarily by the diode carrier lifetime. A relatively long carrier lifetime limits the maximum modulation while a very short carrier lifetime produces RF non-linearity at low RF frequencies. If a shorter carrier lifetime were used, for example, the modulating range and the carrier range could be scaled upwards.

The use of a single bias input source makes the overall circuit of FIG. 1 relatively insensitive to changes in bias input supply voltage and permits the circuit to be easily and effectively adapted to provide for compensation for insertion loss variations due to temperature changes. Thus, in the circuitry of FIG. 1 a thermistor 33 can be used in series with resistance 31 (alternatively, in some applications the thermistor can be used without the need for a separate resistance in series therewith). Changes in temperature cause appropriate changes to occur in the thermistor resistance, as is well-known, to provide appropriate changes in the bias voltages applied to diodes 17 and 18 to compensate therefor.

The use of a variable trimming resistor 26 permits the desired matching of diode characteristics. The significance of matching the diodes by such technique rather than by the usual method of inserting a bias current, as discussed above, can be best seen by considering the following expressions for the diode resistance as a function of the bias current:

$$R_{17} = \frac{K_{17}}{I^\alpha}$$

$$R_{18} = \frac{K_{18}}{I^\alpha}$$

Where $R_{17}$ and $R_{18}$ are the RF resistances of diodes 17 and 18, respectively, typically $\alpha = 0.87$, and $K_{17}$ and $K_{18}$ are constants associates with the diodes. The constant K in each case varies widely from diode to diode, but the constant $\alpha$ remains relatively the same for all diode types and is normally about the value indicated above.

If the matching of PIN diodes is performed by the usual method of inserting an additional bias current through one of the diodes, the two diodes are found to have the same resistance at one value of the control currents therethrough and the above expressions are as follows:

$$R'_{17} = K_{17}/(I_0 + \Delta I)^{.87} = R_{18}, \text{ only when } I = I_0$$

where $I_0$ is the selected value of control currents.

However, using the trimming technique of the invention, as discussed above, the current through one of the diodes is varied by a factor B so that the above expressions for the diode resistances are as follows:

$$R''_{17} = K_{17}/(BI)^{.87} = \frac{K_{18}}{I^{.87}} = R_{18}$$

for all values of I. Accordingly, such technique permits the matching of the diodes over the entire range of control currents. The practical advantage of such a technique is that the diodes do not have to be selected as carefully for the circuit in order to achieve a given level of performance, since diodes which do not match as closely as required for other circuit arrangements can still be used herein with appropriate adjustment of the resistor 26 to achieve the desired matching of their characteristics over the entire control current range.

In a particular successfully used circuit the PIN diodes utilized have a carrier life time of about 1 microsecond. After the diodes are installed, an appropriate measurement can be made which determines the value for resistors 26 in order to trim out any residual unbalance between the diodes.

Modifications to the specific circuitry discussed above will occur to those in the art to perform the desired function thereof. In any such modifications the following principles will apply. The bias input, if positive, must be supplied to the anodes of both diodes and, if negative, must be supplied to the cathodes thereof. The base-band input must be supplied to the same terminal of one of the diodes as that to which its bias input is supplied, while being supplied to the opposite terminal of the other diode from that to which its bias input is supplied. The RF signal can be supplied to any of the diode terminals independently of how the bias inputs and base-band input are connected, while the output signal supplied to the combining means is taken in each case from the diode terminal opposite to that at which the RF signal is supplied.

Hence, the invention is not to be limited to the particular embodiment shown and described above except as limited to the appended claims.

What is claimed is:

1. Signal processing circuitry for processing a first input signal and a second input signal, said circuitry comprising first and second current controllable resistance means, each having a first and a second terminal;

input circuit means for supplying said first input signal to one of said first and second terminals of said first current controllable resistance means and to one of said first and second terminals of said second current controllable resistance means;

said input circuit means further supplying said second input signal to one of said first and second terminals of said first current controllable resistance means and to the other of said first and second terminals of said second current controllable resistance means;

bias circuit means for applying the same bias voltage input to the same selected one of said first and second terminals of each of said first and second controllable resistance means;

output circuit means responsive to the signal at the terminal of said first current controllable resistance means opposite to the one at which said first input signal is supplied and responsive to the signal at the terminal of said second current controllable resistance means opposite to the one at which said first input signal is supplied for combining said signals to produce an output signal which is the product of said first input signal and said second input signal.

2. Signal processing circuitry in accordance with claim 1 and further including variable resistance means connected to a selected one of said first and second current controllable resistance means for controlling the current through said selected current controllable resistance means to match the characteristics of said first and second current controllable resistance means.

3. Signal processing circuitry for processing a first input signal and a second input signal, said circuitry comprising first and second current controllable resistance means, each having a first terminal and a second terminal;

input circuit means for supplying said first input signal to one of said first and second terminals of said first current controllable resistance means and to one of said first and second terminals of said second current controllable resistance means;

said input circuit means further supplying said second input signal to a one of said first and second terminals of said first current controllable resistance means and to the other of said first and second terminals of said second current controllable resistance means;

bias circuit means for applying a bias voltage input to each of said first and second current controllable resistance means;

variable resistance means connected to a selected one of said first and second current controllable resistance means for controlling the current through said selected current controllable resistance means to match the characteristics of said first and second current controllable resistance means; and output circuit means responsive to the signal at the terminal of said first current controllable resistance means opposite to the one at which said first input signal is supplied and responsive to the signal at the terminal of said second current controllable resistance means opposite to the one at which said first input signal is supplied for combining said signals to produce an output signal.

4. Signal processing circuitry in accordance with claims 1, 2 or 3 wherein said first and second current controllable resistance means are first and second diode means.

5. Signal processing circuitry in accordance with claim 4 wherein the first terminals of each of said first and second diode means are the anode terminals thereof and the second terminals of the said first and second diode means are the cathodes thereof.

6. Signal processing circuitry in accordance with claim 4 wherein said first and second diode means are PIN diode means.

7. Signal processing circuitry in accordance with claim 5 wherein said first and second diode means are PIN diode means.

8. Signal processing circuitry in accordance with claims 1, 2 or 3 and further including thermistor means in said bias circuit means for compensating for changes in the operating characteristics of said circuitry because of temperature changes thereof.

9. Signal processing circuitry in accordance with claim 4 and further including thermistor means in said bias circuit means for compensating for changes in the operating characteristics of said circuitry because of temperature changes thereof.

10. Signal processing circuitry in accordance with claim 5 and further including thermistor means in said bias circuit means for compensating for changes in the operating characteristics of said circuitry because of temperature changes thereof.

* * * * *